(12) United States Patent
Do

(10) Patent No.: US 8,429,319 B2
(45) Date of Patent: Apr. 23, 2013

(54) MULTI-PORT MEMORY DEVICE WITH SERIAL INPUT/OUTPUT INTERFACE

(75) Inventor: Chang-Ho Do, Kyoungki-do (KR)

(73) Assignee: Hynix Semiconductor Inc. (KR)

(*) Notice: Subject to any disclaimer, the term of this patent is extended or adjusted under 35 U.S.C. 154(b) by 396 days.

(21) Appl. No.: 11/523,497

(22) Filed: Sep. 18, 2006

(65) Prior Publication Data
US 2007/0070795 A1 Mar. 29, 2007

(30) Foreign Application Priority Data

Sep. 28, 2005 (KR) .................. 10-2005-0090858
Apr. 11, 2006 (KR) .................. 10-2006-0032949

(51) Int. Cl.
*G06F 13/38* (2006.01)

(52) U.S. Cl.
USPC ............................................ 710/71; 710/306

(58) Field of Classification Search ............ 710/71
See application file for complete search history.

(56) References Cited

U.S. PATENT DOCUMENTS

| 4,504,870 | A | * | 3/1985 | Kitamura et al. ............... 360/25 |
| 5,412,789 | A |   | 5/1995 | Ohki |
| 5,796,745 | A |   | 8/1998 | Adams et al. |
| 6,016,525 | A | * | 1/2000 | Corrigan et al. ............... 710/100 |
| 6,122,218 | A |   | 9/2000 | Kang |
| 6,539,488 | B1 | * | 3/2003 | Tota et al. ..................... 713/400 |
| 6,594,196 | B2 |   | 7/2003 | Hsu et al. |
| 6,845,429 | B2 |   | 1/2005 | Mattausch et al. |
| 6,848,067 | B2 | * | 1/2005 | Perner ........................... 714/729 |
| 6,877,071 | B2 | * | 4/2005 | Sherman ........................ 711/149 |
| 2002/0146025 | A1 |   | 10/2002 | Okina |
| 2003/0123320 | A1 | * | 7/2003 | Wright et al. ................. 365/233 |
| 2003/0217313 | A1 | * | 11/2003 | Pfeiffer et al. ................ 714/719 |
| 2005/0047255 | A1 | * | 3/2005 | Park et al. ................. 365/230.05 |
| 2005/0108459 | A1 | * | 5/2005 | Pochmuller ....................... 711/2 |
| 2005/0251713 | A1 |   | 11/2005 | Lee |
| 2006/0107154 | A1 | * | 5/2006 | Bansal et al. .................. 714/738 |
| 2006/0129740 | A1 | * | 6/2006 | Ruckerbauer et al. ............ 711/5 |

FOREIGN PATENT DOCUMENTS

| CN | 1575525 | 2/2005 |
| JP | 5-334898 | 12/1993 |
| JP | 8-96596 | 4/1996 |
| JP | 10-097798 | 4/1998 |
| JP | 2002-230977 | 8/2002 |
| KR | 10-2005-0022855 | 3/2005 |
| TW | 274138 | 4/1996 |
| TW | 200519963 | 6/2005 |

* cited by examiner

*Primary Examiner* — Henry Tsai
*Assistant Examiner* — John Roche
(74) *Attorney, Agent, or Firm* — Blakely, Sokoloff, Taylor & Zafman

(57) ABSTRACT

A multi-port memory device includes a plurality of serial I/O data pads for providing a serial input/output (I/O) data communication; a plurality of ports for performing the serial I/O data communication with external devices through the serial I/O data pads; a plurality of banks for performing a parallel I/O data communication with the ports; a plurality of first data buses for transferring first signals from the ports to the banks; a plurality of second data buses for transferring second signals from the banks to the ports; and a switching unit for connecting the first data buses with the second data buses in response to a control signal.

32 Claims, 6 Drawing Sheets

MULTI-PORT MEMORY DEVICE WITH SERIAL INPUT/OUTPUT INTERFACE

FIELD OF THE INVENTION

The present invention relates to a multi-port memory device; and, more particularly, to a multi-port memory device with a serial input/output (I/O) interface for detecting faults of ports converting parallel/serial data regardless of faults of banks having a core.

DESCRIPTION OF RELATED ARTS

Generally, most memory devices including random access memory (RAM) have a single port with a plurality of input/output pin sets. That is, the single port is provided for data exchange between a memory device and an external chipset. Such a memory device having the single port uses a parallel input/output (I/O) interface to simultaneously transmit multi-bit data through signal lines connected to a plurality of input/output (I/O) pins. The memory device exchanges data with the external device through a plurality of I/O pins in parallel.

The I/O interface is an electrical and mechanical scheme to connect unit devices having different functions through signal lines and transmit transmission/reception data precisely. The signal line is a bus for transmitting an address signal, a data signal, and a control signal. A signal line, described below, will be referred as a bus.

The parallel I/O interface has high data processing efficiency (speed) because it can simultaneously transmit multi-bit data through a plurality of buses. Therefore, the parallel I/O interface is widely used for a short distance transmission that requires a high speed. In the parallel I/O interface, however, the number of buses for transmitting I/O data increases. Consequently, as distance increases, the manufacturing cost increases. Due to the limitation of the single port, a plurality of memory devices are independently configured so as to support various multi-media functions in terms of hardware of a multi-media system. While an operation for a certain function is carried out, an operation for another function cannot be concurrently carried out.

Considering the disadvantage of the parallel I/O interface, many attempts to change the parallel I/O interface into serial I/O interface have been made. Also, considering compatible expansion with devices having other serial I/O interfaces, the change to serial I/O interface in I/O environment of the semiconductor memory device is required. Moreover, appliance devices for audio and video are embedded into display devices, such as a high definition television (HDTV) and a liquid crystal display (LCD) TV. Because these appliance devices require independent data processing, there is a demand for multi-port memory devices having a serial I/O interface using a plurality of ports.

A conventional multi-port memory device having a serial I/O interface includes a processor for processing serial I/O signals, and a DRAM core for performing a parallel low-speed operation. The processor and the DRAM core are implemented on the same wafer, that is, a single chip.

FIG. 1 is a block diagram of a conventional multi-port memory device having a serial I/O interface. For convenience of explanation, the multi-port memory device having two ports and four banks is illustrated.

The multi-port memory device having the serial I/O interface includes a plurality of serial I/O pads TX0+, TX0−, TX1+, TX1−, RX0+, RX0−, RX1+and RX1−, first and second ports PORT0 and PORT1, first to fourth banks BANK0 to BANK3, global input/output (I/O) data buses PTX0<0:3>, PTX1<0:3>, PRX0<0:3> and PRX1<0:3>.

The multi-port memory device has to be configured such that signals inputted through the first and second ports PORT0 and PORT1 (hereinafter, referred to as "input valid data signals") can be inputted to all banks BANK0 to BANK3, and signals outputted from the first to fourth banks BANK0 to BANK3 (hereinafter, referred to as "output valid data signals") can be selectively transferred to all ports PORT0 and PORT1.

For this purpose, the first and second ports PORT0 and PORT1 and the first to fourth banks BANK0 to BANK3 are connected together through the global I/O data buses. The global I/O data buses include input buses PRX0<0:3> and PRX1<0:3> for transferring the input valid data signals from the first and second ports PORT0 and PORT1 to the first to fourth banks BANK0 to BANK3, and output buses PTX0<0:3> and PTX1<0:3> for transferring the output valid data signals from the first to fourth banks BANK0 to BANK3 to the first and second ports PORT0 and PORT1.

The input valid data signals from the first and second ports PORT0 and PORT1 contain information on a bank selection signal for selecting a corresponding one of the first to fourth banks BANK0 to BANK3. Therefore, signals indicating which ports the signals access and which banks access through the ports are inputted to the first to fourth banks BANK0 to BANK3. Accordingly, the port information is selectively transferred to the banks and the bank information is transferred to the first and second ports PORT0 and PORT1 via the global I/O data buses.

Each of the first and second ports PORT0 and PORT1 includes a serializer & deserializer (SERDES). The SERDES parallelizes the input valid data signals inputted through the reception pads RX0+, RX0−, RX1+and RX1− to output parallel input valid data signals as a low speed data communication scheme to a DRAM core of the first to fourth banks BANK0 to BANK3 via the input buses PRX0<0:3> and PRX1<0:3>. In addition, the SERDES serializes the output valid data signals, which are outputted from the DRAM core of the first to fourth banks BANK0 to BANK3 via the output buses PTX0<0:3> and PTX1<0:3> in parallel, as a high speed data communication scheme, and outputs them to the transmission pads TX0+, TX0−, TX1+and TX−.

FIG. 2 is a block diagram of the first port PORT0 illustrated in FIG. 1. The second port PORT1 has the same structure as that of the first port PORT0, and thus the first port PORT0 will be described as an exemplary structure.

The first port PORT0 performs a data communication with external devices through a serial input/output (I/O) interface including transmission pads TX0+ and TX0−, and reception pads RX0+ and RX0−. Signals inputted through the reception pads PX0+ and RX0− are serial high-speed input signals, and the signals outputted through the transmission pads TX0+ and TX0− are serial high-speed output signals. Generally, the high-speed I/O signals include differential signals for recognizing the high-speed I/O signals smoothly. The differential I/O signals are distinguished by indicating the serial I/O interface TX0+, TX0−, RX0+ and RX0− with "+" and "−".

The first port PORT0 includes a driver 21, a serializer 22, an input latch 23, a clock generator 24, a sampler 25, a deserializer 26, and a data output unit 27.

The clock generator 24 receives a reference clock RCLK from an external device to generate an internal clock.

The input latch 23 latches the output valid data signals outputted via the output bus PTX0<0:3> from the banks in synchronization with the internal clock and transfers the latched signals to the serializer 22.

The serializer 22 serializes the parallel output valid data signals inputted from the input latch 23 in synchronization with the internal clock, and outputs the serial output valid data signals to the driver 21.

The driver 21 outputs the output valid data signals serialized by the serializer 22 to the external devices through the transmission pads TX0+ and TX0− in a differential type.

The sampler 25 samples external signals inputted from the external device through the reception pads RX0+ and RX0− in synchronization with the internal clock and transfers the sampled signals to the deserializer 26.

The deserializer 26 deserializes the external signals inputted from the sampler 25 in synchronization with the internal clock, and outputs the parallel input valid data signals to the data output unit 27.

The data output unit 27 transfers the input valid data signals from the deserializer 26 to the banks via the input bus PRX0<0:3>.

An operation characteristic of the first ports PORT0 will be described below in detail.

First, a process of deserializing the external signals and transferring the parallel input valid data signals via the input bus PRX0<0:3> will be described. The external signals are inputted from the external devices through the reception pads RX0+ and RX0− in a frame form at high speed.

The external signals are sampled through the sampler 25 in synchronization with the internal clock outputted from the clock generator 24. The sampler 25 transfers the sampled external signals to the deserializer 26. The deserializer 26 deserializes the external signals inputted from the sampler 25 in synchronization with the internal clock, and outputs the deserialized signals as the parallel input valid data signal to the data output unit 27. The data output unit 27 transfers the parallel input valid data signal to the banks via the input bus PRX0<0:3>.

Next, a process of serializing the parallel output valid data signals outputted via the output bus PTX0<0:3> and transferring them to the external devices through the transmission pads TX0+ and TX0− will be described below.

The parallel output valid data signals are transferred to the input latch 23 via the output bus PTX0<0:3>. The input latch 23 latches the output valid data signals in synchronization with the internal clock and transfers the latched signals to the serializer 22. The serializer 22 serializes the output valid data signals transferred from the input latch 23 in synchronization with the internal clock to transfer the serialized signals to the driver 21. The driver 21 outputs the serialized signals to the external devices through the transmission pads TX0+ and TX0−.

As described above, the conventional multi-port memory device includes the banks having the DRAM core for storing cell data, and the ports to perform the data communication with the external devices in the high-speed serial I/O interface. Such multi-port memory device recognizes faults based on signals input from an external source or output to an external destination during a normal operation. Accordingly, it is difficult to determine whether the faults occur in the ports or in the bank having the DRAM core.

SUMMARY OF THE INVENTION

It is, therefore, an object of the present invention to provide a multi-port memory device capable of detecting faults of ports converting parallel/serial data regardless of faults of banks having a core.

In accordance with an aspect of the present invention, there is provided a multi-port memory device including: a plurality of serial input/output (I/O) data pads; a plurality of ports for performing the serial I/O data communication with external devices through the serial I/O data pads; a plurality of banks for performing a parallel I/O data communication with the ports; a plurality of first data buses for transferring first signals from the ports to the banks; a plurality of second data buses for transferring second signals from the banks to the ports; and a switching unit for connecting the first data buses with the second data buses in response to a control signal.

In accordance with another aspect of the present invention, there is provided a multi-port memory device including: a plurality of serial input/output (I/O) data pads; a test pad receiving a mode control signal; a plurality of ports for performing the serial I/O data communication with external devices through the serial I/O data pads; a plurality of banks for performing a parallel I/O data communication with the ports; a plurality of first data buses for transferring first signals from the ports to the banks; a plurality of second data buses for transferring second signals from the banks to the ports; a test mode determination unit for generating a test mode enable signal in response to the mode control signal inputted through the test pad from an external device; and a plurality of switching units for connecting the first data buses with the second data buses in response to the test mode enable signal.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Hereinafter, a multi-port memory device with a serial input/output (I/O) interface in accordance with exemplary embodiments of the present invention will be described in detail with reference to the accompanying drawings.

Figure 1:
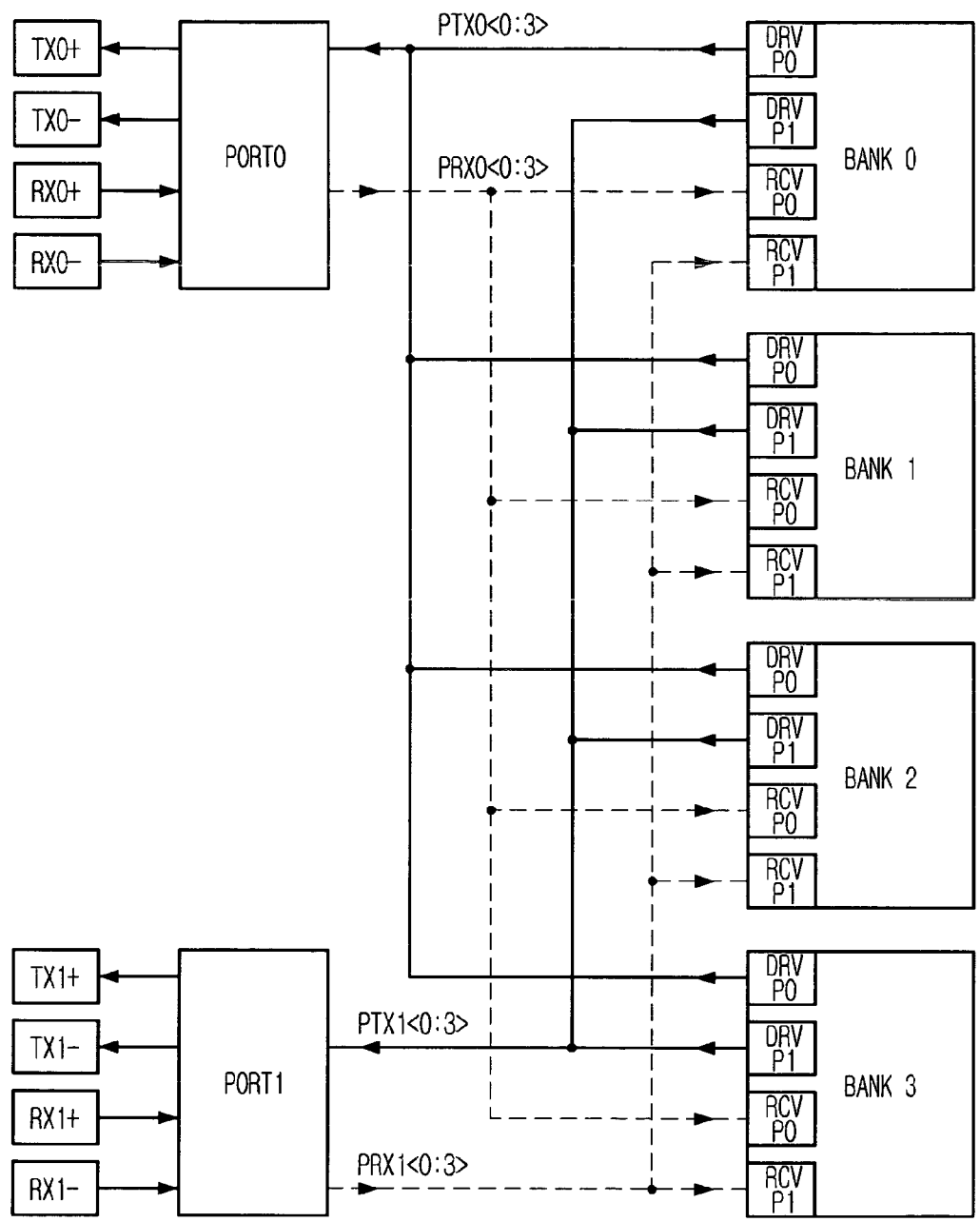
FIG. 1 is a block diagram of a conventional multi-port memory device.
Figure 2:
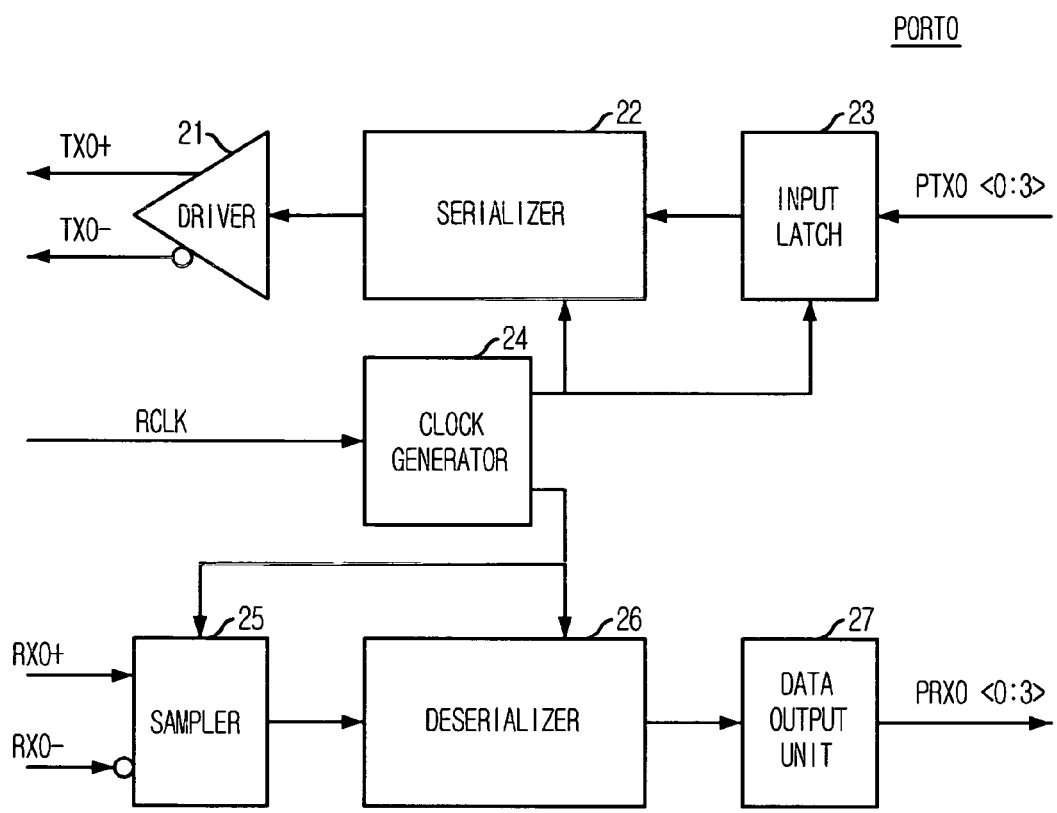
FIG. 2 is a block diagram of a first port illustrated in FIG. 1.
Figure 3:
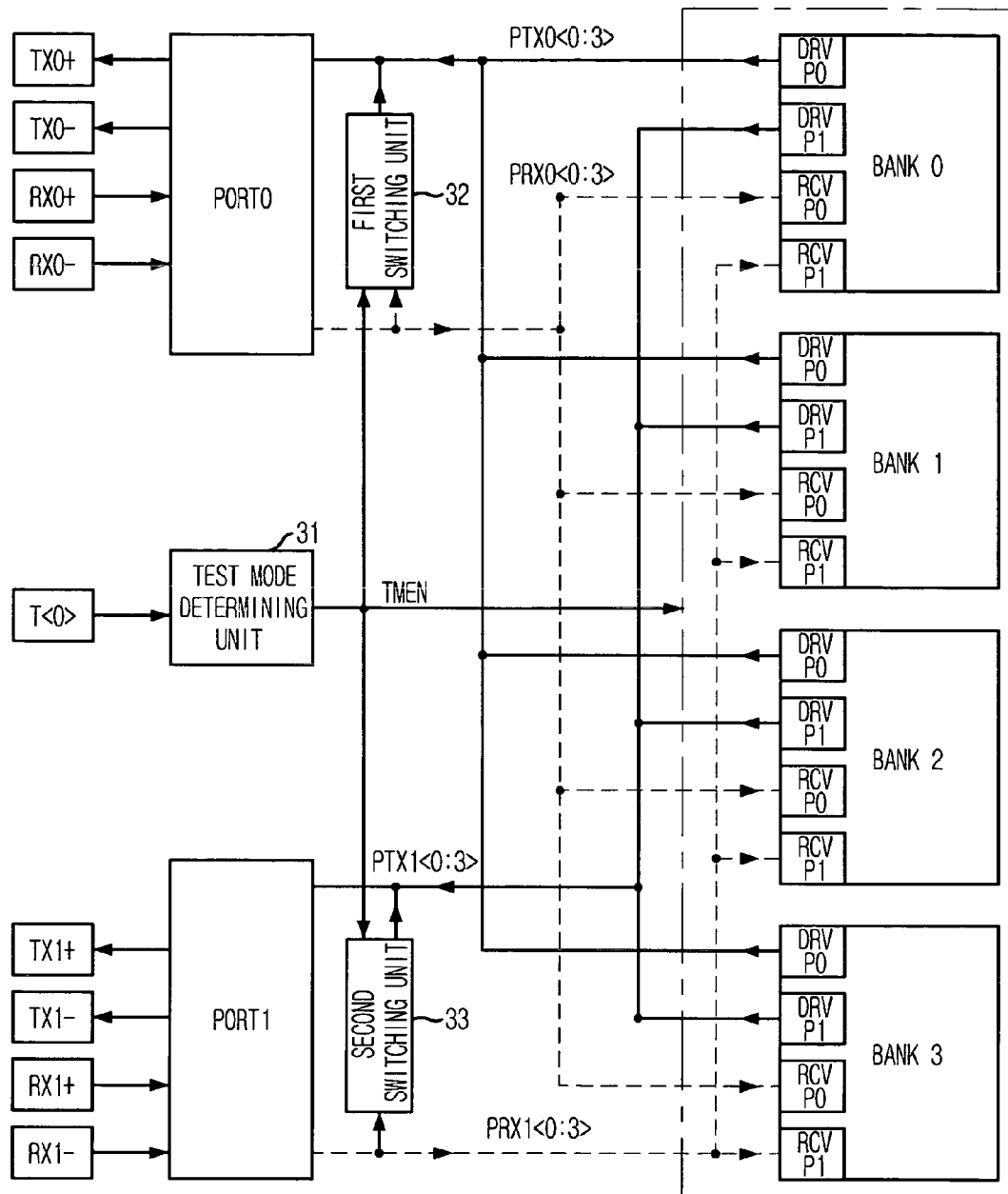
FIG. 3 is a block diagram of a multi-port memory device in accordance with an embodiment of the present invention.

FIG. 3 is a block diagram of a multi-port memory device in accordance with an embodiment of the present invention. For convenience of explanation, the multi-port memory device having two ports and four banks is illustrated.

The multi-port memory device includes a plurality of serial I/O pads TX0+, TX0−, TX1+, TX1−, RX0+, RX0−, RX1+ and RX1−, a test mode control pad T<0>, a test mode determination unit 31, first and second switching units 32 and 33, first and second ports PORT0 and PORT1, first to fourth banks BANK0 to BANK3, and a plurality of global input/output (I/O) data buses PTX0<0:3>, PTX1<0:3>, PRX0<0:3>, and PRX1<0:3>.

The plurality of serial I/O pads support a data communication between the port PORT0 and the second port PORT1 and external devices in high-speed serial I/O interface. The serial I/O pads include transmission pads such as TX0+, TX0−, TX1+ and TX1− and reception pads such as RX0+, RX0−, RX1+ and RX1−. The transmission pads TX0+, TX0−, TX1+ and TX1− transfer signals which are serialized and outputted from the first and second ports PORT0 and PORT1 to the external devices. The reception pads RX0+, RX0−, RX1+ and RX1− transfer signals inputted from the external devices to the first and second ports PORT0 and PORT1. Herein, the numbers of reception pads and transmission pads may be adjusted according to the bit number of processing data during a normal operation. For convenience of explanation, a unit of processing data is set to 4-bit unit.

Each of the first and second ports PORT0 and PORT1 includes a serializer & deserializer (SERDES). The SERDES parallelizes the signals inputted through the reception pads RX0+, RX0−, RX1+ and RX1− and outputs parallel input valid data signals as a low speed data communication scheme to a DRAM core of the first to fourth banks BANK0 to BANK3 via the input buses PRX0<0:3> and PRX1<0:3>. The SERDES serializes parallel output valid data signals, which are outputted from the DRAM core of the first to fourth banks BANK0 to BANK3 via the output buses PTX0<0:3> and PTX1<0:3>, as a high speed data communication scheme and outputs them to the transmission pads TX0+, TX0−, TX1+ and TX1−.

The plurality of global I/O data buses include input buses PRX0<0:3> and PRX1<0:3> for transferring the parallel input valid data signals from the first and second ports PORT0 and PORT1 to the first to fourth banks BANK0 to BANK3, and output buses PTX0<0:3> and PTX1<0:3> for transferring the parallel output valid data signals from the first to fourth banks BANK0 to BANK3 to the first and second ports PORT0 and PORT1.

The test mode determination unit 31 generates a test mode enable signal TMEN in response to a test mode control signal inputted through the test mode control pad T<0> from an external source. The test mode enable signal TMEN determines whether a test mode enters or not. The test mode enable signal TMEN has the same phase and period as those of the test mode control signal, or has the same period and a different phase.

The first switching unit 32 connects a first input bus PRX0<0:3> with a first output bus PTX0<0:3> in response to the test mode enable signal TMEN output from the test mode determination unit 31.

The second switching unit 33 connects a second input bus PRX1<0:3> with a second output bus PTX1<0:3> in response to the test mode enable signal TMEN output from the test mode determination unit 31.

Meanwhile, in accordance with the embodiment of the present invention, each bank BANK0 to BANK3 includes first and second output drivers DRVP0 and DRVP1, and first and second receivers RCVP0 and RCVP1. The first and second output drivers DRVP0 and DRVP1 do not operate during the test mode so as not to transfer the parallel output valid data signals output from a corresponding bank to the output buses PTX0<0:3> and PTX1<0:3>. For this purpose, the first and second output drivers DRVP0 and DRVP1 are controlled based on the test mode enable signal TMEN.

Figure 4:
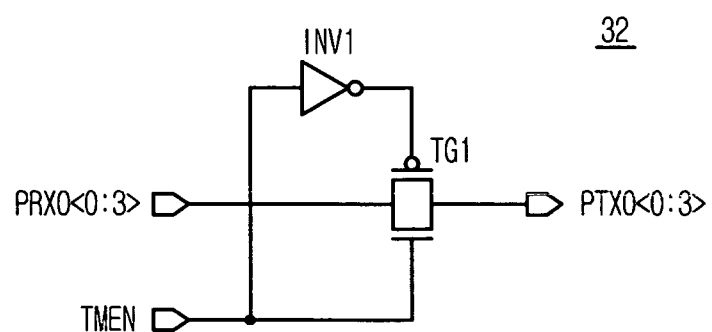
FIG. 4 is a circuit diagram of a first switching unit illustrated in FIG. 3.

FIG. 4 is a circuit diagram of the first switching unit 32 illustrated in FIG. 3.

The first switching unit 32 includes an inverter INV1 and a transfer gate TG1 including a PMOS transistor and an NMOS transistor. The inverter INV1 inverts the test mode enable signal TMEN to output an inverted test mode enable signal. The transfer gate TG1 transfers the parallel input valid data signals from the first input bus PRX0<0:3> to the first output bus PTX0<0:3> in response to the test mode enable signal TMEN and the inverted test mode enable signal during the test mode.

When the test mode enters, the test mode enable signal TMEN is activated. Accordingly, the first switching unit 32 connects the first input bus PRX0<0:3> with the first output bus PTX0<0:3> in response to the test mode enable signal TMEN, and thus transfers the parallel input valid data signals from the first input bus PRX0<0:3> to the first output bus PTX0<0:3>.

There are no parallel output valid data signals output from each bank via the first output bus PTX0<0:3> during the test mode, because the first output driver DVRP0 of each bank connected with the first port PORT0 via the first output bus PTX0<0:3> does not operate. As a result, the first port PORT0 serializes data signals output from the first switching unit 32 via the first output bus PTX0<0:3> to transfer them to the transmission pads TX0+ and TX0−.

Figure 5:
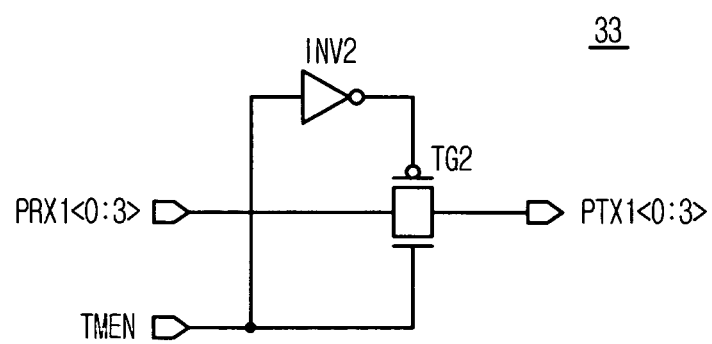
FIG. 5 is a circuit diagram of a second switching unit illustrated in FIG. 3.

FIG. 5 is a circuit diagram of the second switching unit 33 illustrated in FIG. 3.

The second switching unit 33 includes an inverter INV2 and a transfer gate TG2 including a PMOS transistor and an NMOS transistor. The inverter INV2 inverts the test mode enable signal TMEN to output an inverted test mode enable signal. The transfer gate TG2 transfers the parallel input valid data signals from the second input bus PRX1<0:3> to the second output bus PTX1<0:3> in response to the test mode enable signal TMEN and the inverted test mode enable signal during the test mode.

When the test mode enters, the test mode enable signal TMEN is activated. Accordingly, the second switching unit 33 connects the second input bus PRX1<0:3> with the second output bus PTX1<0:3> in response to the test mode enable signal TMEN, and thus transfers the parallel input valid data signals from the second input bus PRX1<0:3> to the second output bus PTX1<0:3>.

There are no parallel output valid data signals output from each bank via the second output bus PTX1<0:3> during the test mode, the second output driver DVRP1 of each bank connected with the second port PORT1 via the second output bus PTX1<0:3> does not operate. As a result, the second port PORT1 serializes data signals output from the second switching unit 33 via the second output bus PTX1<0:3> to transfer them to the transmission pads TX1+ and TX1−.

Figure 6:
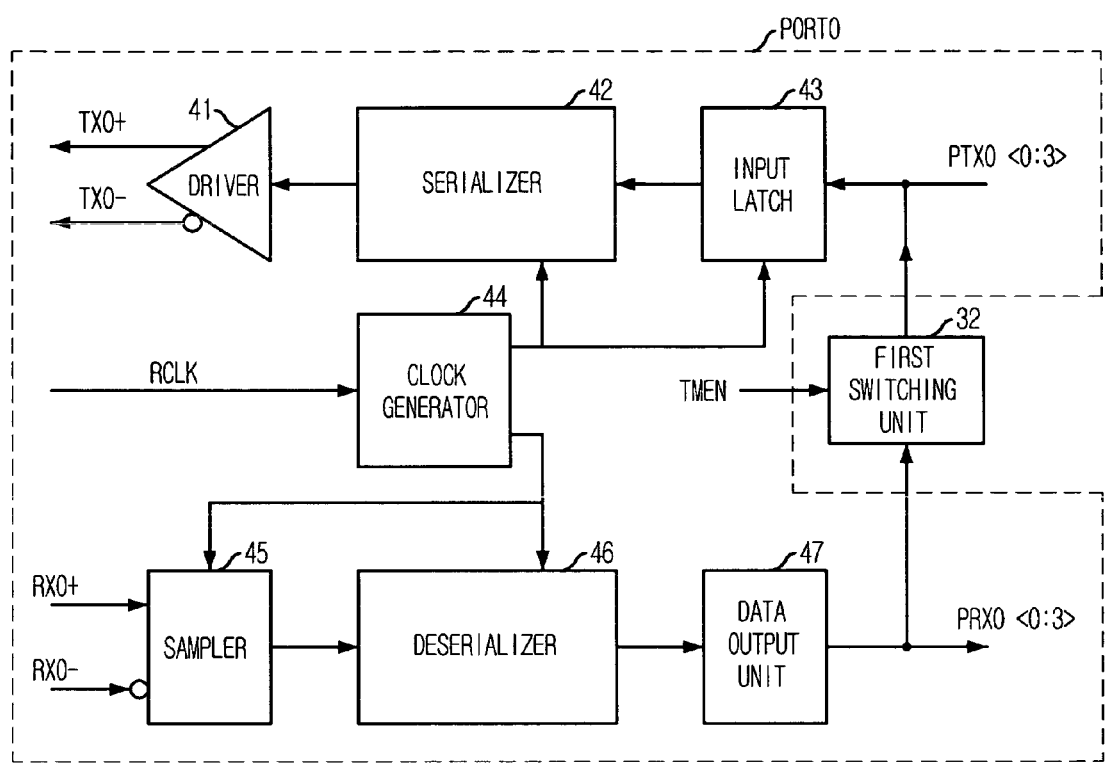
FIG. 6 is a circuit diagram of a first port illustrated in FIG. 3.

FIG. 6 is a circuit diagram of the first port PORT0 illustrated in FIG. 3. The second port PORT1 has the same structure as that of the first port PORT0, and thus the first port PORT0 will be described as an exemplary structure.

The first port PORT0 includes a serializer & deserializer (SERDES). The PORT0 includes a driver 41, a serializer 42, an input latch 43, a clock generator 44, a sampler 45, a deserializer 46, and a data output unit 47.

The clock generator 44 receives a reference clock RCLK from the external to generate an internal clock. The internal clock may includes a phase locked loop (PLL) for generating a plurality of internal clocks having various period or a predetermined phase difference, or a delay locked loop (DLL) for generating the internal clock by delaying the reference clock RCLK by a predetermined time. Meanwhile, the clock generators provided in the first and second ports PORT0 and PORT1 may be independent of each other, or may be shared in one chip in common.

The input latch 43 latches the parallel output valid data signals outputted via the first output bus PTX0<0:3> from the banks in synchronization with the internal clock and transfers the latched signals to the serializer 42.

The serializer 42 serializes the parallel output valid data signals inputted from the input latch 43 in synchronization with the internal clock, and outputs the serial output valid data signals to the driver 41.

The driver 41 outputs the output valid data signals serialized by the serializer 42 to the external devices through the transmission pads TX0+ and TX0− in a differential type.

The sampler 45 samples external signals inputted from the external devices through the reception pads RX0+ and RX0− in synchronization with the internal clock and transfers the sampled signals to the deserializer 46.

The deserializer 46 deserializes the external signals inputted from the sampler 45 in synchronization with the internal clock, and outputs the parallel input valid data signals to the data output unit 47.

The data output unit 47 transfers the parallel input valid data signals from the deserializer 46 to the banks via the first input bus PRX0<0:3>.

An operation characteristic of the first ports PORT0 will be described below in detail.

First, a process of deserializing the external signals and transferring the parallel input valid data signals via the first input bus PRX0<0:3> will be described. The external signals are inputted from the external devices through the reception pads RX0+ and RX0− in a frame form at high speed.

The external signals are sampled through the sampler 45 in synchronization with the internal clock outputted from the clock generator 44. The sampler 45 transfers the sampled external signals to the deserializer 46. The deserializer 46 deserializes the external signals inputted from the sampler 45 in synchronization with the internal clock, and outputs the deserialized signals as the parallel input valid data signal to the data output unit 47. The data output unit 47 transfers the parallel input valid data signal to the banks via the first input bus PRX0<0:3>.

Next, a process of serializing the parallel output valid data signals outputted via the first output bus PTX0<0:3> and transferring them to the external devices through the transmission pads TX0+ and TX0− will be described below.

The parallel output valid data signals are transferred to the input latch 43 via the first output bus PTX0<0:3>. The input latch 43 latches the parallel output valid data signals in synchronization with the internal clock and transfers the latched signals to the serializer 42. The serializer 42 serializes the parallel output valid data signals transferred from the input latch 43 in synchronization with the internal clock and transfers the output valid data signals to the driver 41. The driver 41 outputs the output valid data signals to the external devices through the transmission pads TX0+ and TX0−.

Figure 7:
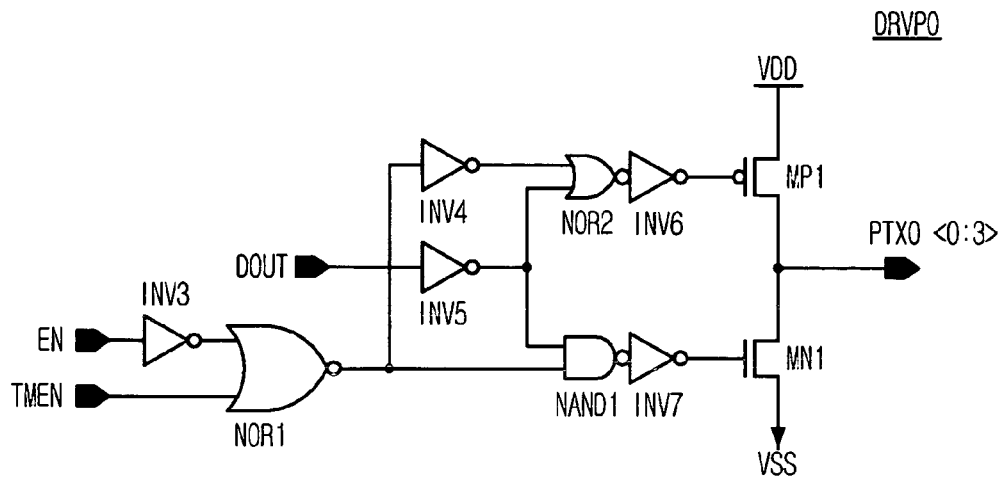
FIG. 7 is a circuit diagram of a first output driver of each bank illustrated in FIG. 3.

FIG. 7 is a circuit diagram of the first output driver DRVP0 of each bank illustrated in FIG. 3. The second output driver DRVP1 has the same structure as that of the first output driver DRVP0, and thus the first output driver DRVP0 will be described as an exemplary structure.

The first output driver DRVP0 includes a plurality of inverters INV3 to INV7, a NAND gate NAND1, first and second NOR gates NOR1 and NOR2, a pull-up transistor MP1, and a pull-down transistor MN1.

The first inverter INV3 inverts a chip enable signal EN. The first NOR gate NOR1 performs a NOR operation on an output of the first inverter INV3 and the test mode enable signal TMEN. That is, if the test mode enable signal TMEN is activated when the test mode is entered, an output of the first NOR gate NOR1 has a logic level "LOW".

The second inverter INV4 inverts the output of the first NOR gate NOR1, and the third inverter INV5 inverts cell data DOUT output from a corresponding bank. The second NOR gate NOR2 performs a NOR operation on outputs of the second and third inverters INV4 and INV5. The fourth inverter INV6 inverts an output of the second NOR gate NOR2. The pull-up transistor MP1 includes a gate receiving an output of the fourth inverter INV6 and a source-drain path between a source voltage (VDD) terminal and an output node. Accordingly, if the test mode enable signal TMEN is activated, the output of the fourth inverter INV6 has a logic level "HIGH" and thus the pull-up transistor MP1 is turned off.

The NAND gate NAND1 performs a NAND operation on outputs of the first NOR gate NOR1 and the third inverter INV5. The fifth inverter INV7 inverts an output of the NAND gate NAND1. The pull-down transistor MN1 includes a gate receiving an output of the fifth inverter INV7 and a source-drain path between a ground voltage (VSS) terminal and the output node. Accordingly, if the test mode enable signal TMEN is activated, the output of the fifth inverter INV7 has a logic level "LOW" and thus the pull-down transistor MN1 is turned off.

Accordingly, during the test mode, the first output driver DRVP0 does not transfer the cell data DOUT output from the first bank BANK0 to the first output bus PTX0<0:3> in response to the test mode enable signal TMEN which is activated with a logic level "HIGH" during the test mode.

On the other hand, during a normal mode, the test mode enable signal TMEN is inactivated with a logic level "LOW". As a result, the first output driver DRVP0 transfers the cell data DOUT to the first output bus PTX0<0:3> in response to the chip enable signal EN. Herein, the chip enable signal EN is a signal capable of enabling a chip. When the chip enable signal EN is activated, the chip enters the normal mode.

Figure 8A:
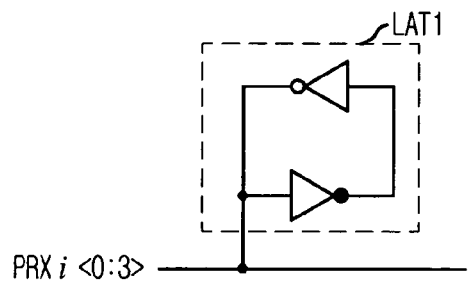
FIGS. 8A and 8B are circuit diagrams of input/output buses shown in FIG. 3, respectively.
Figure 8B:
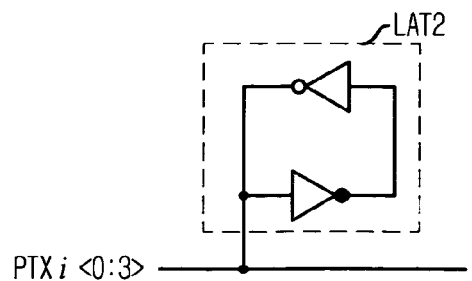

FIGS. 8A and 8B are circuit diagrams of a first input/output bus shown in FIG. 3, respectively.

Referring to FIGS. 8A and 8B, each of input bus PRXi<0:3> and output bus PTXi<0:3> include a latch LAT1 and LAT2 for transferring signal stably. Herein, "i" corresponds to the number of ports. Each latch LAT1 and LAT2 may be an inverter latch composed of two inverters.

Hereinafter, referring to FIGS. 3 to 8B, an operation on the multi-port memory device in accordance with the embodiment of the present invention will be described in detail. For convenience of explanation, the unit of processing data is set to 4-bit unit.

If the test mode control signal is inputted through the test mode control pad T<0>, the test mode determining unit 31 determines an operating mode of the chip, i.e., one of the normal mode and the test mode. If the test mode control signal is a logic level "HIGH", the operating mode of the chip becomes the test mode; otherwise, the operating mode of the chip becomes the normal mode.

First, if the operating mode of the chip is the normal mode, the test mode determining unit 31 inactivates the test mode enable signal TMEN in response to the test mode control signal. The first switching unit 32 disconnects the first input bus PRX0<0:3> with the first output bus PTX0<0:3>, and the second switching unit 33 disconnects the second input bus PRX1<0:3> with the second output bus PTX1<0:3> based on the test mode enable signal TMEN. In this case, the external signals input from the external through the reception pads RX0+, RX0−, RX1+ and RX1− in series are transferred to the first and second ports PORT0 and PORT1.

The sampler 45 of the first and second ports PORT0 and PORT1 samples the external signals in synchronization with the internal clock. The deserializer 46 deserializes the sampled signals in synchronization with the internal clock and outputs the parallel input valid data signals to the data output unit 47 so as to transfer them to each input bus PRXi<0:3>. If the unit of processing data is set to 4-bit unit, a 4-bit data bus is allocated to each port PORT0 and PORT1.

At this time, because the first and second switching units 32 and 33 disconnect each input bus PRXi<0:3> with each output bus PTXi<0:3>, the parallel input valid data signals applied to each input bus PRXi<0:3> are not transferred to each output bus PTXi<0:3>, but are only transferred to the first and second receivers RCVP0 and RCVP1 of each bank BANK0 to BANK3.

The parallel input valid data signals applied to the first and second receivers RCVP0 and RCVP1 are transferred a memory cell array of the DRAM core. At this time, because all ports PORT0 and PORT1 may access all banks BANK0 to BANK3, information for which bank the parallel input valid data signals are valid is required. Therefore, the external signals inputted via the reception pads RX0+, RX0−, RX1+ and RX1− requires extra bits having information on a bank selection signal for selecting a corresponding one of the banks except for the unit of processing data, i.e., 4-bit. When the external signals including the bank selection signal are inputted, the first and second ports PORT1 and PORT2 decode the bank selection signal and transfer the bank selection signal to a bank control unit (not shown) via the input bus PRXi<0:3>. Each bank control unit determines whether the bank selection signal is valid for its bank or not. When the bank selection signal is valid, the other signals inputted via the input buses PRXi<0:3> are transferred to a corresponding bank.

The parallel output valid data signals read from the memory cell array of the DRAM core in response to the bank selection signals are transferred to each port PORT0 and PORT1 via the output bus PTXi<0:3>, and then are serialized by a corresponding port. As a result, the parallel output valid data signals are transferred to the external devices through the transmission pads TX0+, TX0−, TX1+ and TX1−.

Next, if the operating mode of the chip is the test mode, the test mode determining unit 41 activates the test mode enable signal TMEN based on the test mode control signal. Accordingly, the first switching unit 32 connects the first input bus PRX0<0:3> with the first output bus PTX0<0:3>, and the second switching unit 33 connects the second input bus PRX1<0:3> with the second output bus PTX1<0:3>. In this case, the first and second output drivers DRVP0 and DRVP1 becomes a high impedance state because the pull-up transistor MP1 and the pull-down transistor MN1 are turned off based on the test mode enable signal TMEN. Accordingly, the parallel output valid data signals output from the DRAM core of the banks BANK0 to BANK3 are not transferred to the output bus PTXi<0:3>. The sampler 45 of the first and second ports PORT0 and PORT1 samples the external signals inputted from the external device through the reception pads RX0+, RX0−, RX1+ and RX1− in synchronization with the internal clock. Herein, the external signals are test signals for testing the ports. The deserializer 46 deserializes the test signals in synchronization with the internal clock. The data output unit 47 transfers the deserialized test signals to each input bus PRXi<0:3>.

The test signals applied on each input bus PRXi<0:3> are transferred to each output bus PTXi<0:3> by the first and second switching units 32 and 33. In this case, the parallel output valid data signals output from the DRAM core of the banks BANK0 to BANK3 are not transferred to the output buses PTXi<0:3> because the first and second output drivers DRVP0 and DRVP1 becomes the high impedance state. Accordingly, the test signals applied on the input bus PRXi<0:3> are only applied to the output bus PTXi<0:3>.

The test signals applied on the output bus PTXi<0:3> are latched by the input latch 43 of the ports PORT0 and PORT1 in synchronization with the internal clock. The serializer 42 serializes the test signals inputted from the input latch 43 in synchronization with the internal clock, and the driver 41 outputs the test signals serialized by the serializer 42 to the external devices through the transmission pads TX0+, TX0−, TX1+ and TX1−.

Therefore, the test signals inputted in series via the reception pads RX0+, RX0−, RX1+, and RX1− are outputted to the transmission pads TX0+, TX0−, TX1+, and TX1−. At this time, the test signals do not go by the way of the banks, but go by the way of the ports to convert parallel data to serial data and vice versa. As a result, it is possible to test the ports for converting the parallel/serial data regardless of a fault of the DRAM core in the banks.

For convenience of explanation, in accordance with the embodiment of the present invention, it is assumed that the unit of processing data is set to 4-bit unit. Accordingly, the multi-port memory device of the embodiment allocates a 4-bit input bus and a 4-bit output bus per each port.

As described above, in accordance with the present invention, the multi-port memory device performing a data communication with external devices through serial I/O interfaces can test the ports for converting the parallel/serial data regardless of the fault of the DRAM core in the banks.

The present application contains subject matter related to Korean patent application Nos. 2005-90858 & 2006-32949, filed in the Korean Intellectual Property Office on Sep. 28, 2005 and Apr. 11, 2006, the entire contents of which are incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A multi-port memory device, comprising:
   a plurality of serial input/output (I/O) data pads;
   a plurality of ports for performing the serial I/O data communication with external devices through the serial I/O data pads;
   a plurality of banks for performing a parallel I/O data communication with the ports;
   a plurality of first data buses for receiving first signals outputted from the ports, and transferring the first signals to the banks;
   a plurality of second data buses for receiving second signals outputted from the banks, and transferring the second signals to the ports;
   a plurality of switching units for connecting the first data buses with the second data buses one to one in response to a mode enable signal, to transfer the first signals outputted from each of the plurality of ports to the same respective port of origin via the connected first and second data buses, or to transfer the first signals outputted from the ports to the banks via the first data buses; and
   a plurality of output drivers configured to interrupt the transferring of the second signals from the banks to the second data buses in response to the mode enable signal,
   wherein each of the output drivers includes:
   a first inverter for inverting a device enable signal for enabling the multi-port memory device;
   a first ate performing a NOR operation on an output of the first inverter and the mode enable signal;

a second inverter for inverting an output of the first logic gate;

a third inserter for inverting cell data outputted from a corresponding one of the banks;

a second logic gate for performing an OR operation on outputs of the second and third inverters;

a pull-up transistor having a gate receiving an output of the second logic gate and a source-drain path between a source voltage terminal and an output node;

a third logic gate for performing an AND operation on outputs of the first logic gate and the third inverter; and a pull-down transistor having a gate receiving an output of the third logic gate and a source-drain path between a ground voltage terminal and the output node.

2. The multi-port memory device as recited in claim 1, wherein the mode enable signal indicates a test mode or a normal mode.

3. The multi-port memory device as recited in claim 2, further comprising a test pad receiving the mode enable signal.

4. The multi-port memory device as recited in claim 3, wherein the switching units connect the first data buses with the second data buses in response to the mode enable signal indicating the test mode, thereby transferring the first signals outputted from the ports via the first data buses and the second data buses to the ports during the test mode.

5. The multi-port memory device as recited in claim 4, wherein the switching units disconnect the first data buses from the second data buses in response to the mode enable signal indicating the normal mode, thereby transferring the first signals outputted from the ports via the first data buses to the banks.

6. The multi-port memory device as recited in claim 5, wherein each of the switching units includes:

an inverter for inverting the mode enable signal to output an inverted mode enable signal; and a transfer gate for transferring a corresponding one of the first signals from a corresponding one of the first data buses to a corresponding one of the second data buses during the test mode, and intercepting the transferring the first signals during the normal mode, in response to the mode enable signal and the inverted mode enable signal.

7. The multi-port memory device as recited in claim 2, wherein each of the output drivers maintains a high impedance during the test mode in response to the mode enable signal.

8. The multi-port memory device as recited in claim 2, wherein the output drivers transfer the second signals from the banks to the second data buses during the normal mode.

9. The multi-port memory device as recited in claim 8, wherein the ports deserialize input signals inputted in series from the external devices to output the first signals to the banks via the first data buses, and serialize the second signals inputted in parallel from the banks via the second data buses to output the serialized signals to the serial I/O data pads.

10. The multi-port memory device as recited in claim 9, wherein each of the ports includes:

a sampler for sampling the input signals;

a deserializer for deserializing the sampled input signals to output the first signals;

a data output unit for outputting the first signals to the first data buses in parallel;

an input latch for latching the second signals transferred through the second buses in parallel;

a serializer for serializing the latched second signals; and a driver for driving the serialized second signals to the serial I/O data pads.

11. The multi-port memory device as recited in claim 10, further comprising a clock generator for generating an internal clock for synchronizing signals serialized and deserialized by the ports.

12. The multi-port memory device as recited in claim 11, wherein the clock generator generates the internal clock based on a reference clock from an external device.

13. The multi-port memory device as recited in claim 11, wherein the input latch, the serializer, the sampler, and the deserializer are synchronized with the internal clock.

14. The multi-port memory device as recited in claim 11, wherein the input latch latches the first signals transferred by a corresponding one of the switching units via the second data buses during the test mode.

15. The multi-port memory device as recited in claim 14, wherein the serializer serializes the first signals latched by the input latch in synchronization with the internal clock.

16. The multi-port memory device as recited in claim 2, wherein each of the first and second data buses includes a latch for transferring the first or second signals stably.

17. A multi-port memory device, comprising:

a plurality of serial I/O data pads for providing a serial input/output (I/O) data communication;

a test pad receiving a mode control signal;

a plurality of ports for performing the serial I/O data communication with external devices through the serial I/O data pads;

a plurality of banks for performing a parallel I/O data communication with the ports;

a plurality of first data buses for receiving first signals outputted from the ports, and transferring the first signals to the banks;

a plurality of second data buses for receiving second signals outputted from the banks, and transferring second signals to the ports;

a test mode determination unit for generating a test mode enable signal in response to the mode control signal inputted through the test pad from an external device;

a plurality of switching units for connecting the first data buses with the second data buses one to one in response to the test mode enable signal to transfer the first signals outputted from each of the plurality of ports to the same respective port of origin via the connected first and second data buses, or to transfer the first signals outputted from the ports to the banks via the first data buses; and a plurality of output drivers configured to intercept the transferring of the second signals from the banks to the second data buses in response to the test mode enable signal, wherein each of the output drivers includes:

a first inverter for inverting a device enable signal for enabling the multi-port memory device;

a first logic gate performing a NOR operation on an output of the first inverter and the test mode enable signal;

a second inverter for inverting an output of the first logic gate;

a third inverter for inverting cell data outputted from a corresponding one of the banks;

a second logic gate for performing an OR operation on outputs of the second and third inverters;

a pull-up transistor having a gate receiving an output of the second logic gate and a source-drain path between a source voltage terminal and an output node;

a third logic rate for performing an AND operation on outputs of the first to and the third inverter; and a pull-down transistor having a gate receiving an output of the third logic gate and a source-drain path between a ground voltage terminal and the output node.

18. The multi-port memory device as recited in claim 17, wherein, the test mode enable signal indicates a test mode or a normal mode.

19. The multi-port memory device as recited in claim 18, wherein the switching units connect the first data buses with the second data buses in response to the test mode enable signal indicating the test mode, thereby transferring the first signals outputted from the ports via the first data buses and the second data buses to the ports during the test mode.

20. The multi-port memory device as recited in claim 19, wherein the switching units disconnect the first data buses with the second data buses in response to the test mode enable signal indicating the normal mode so as to transfer the first signals outputted from the ports via the first data buses to the banks during the normal mode.

21. The multi-port memory device as recited in claim 20, wherein each of the switching units includes:
  an inverter for inverting the test mode enable signal to output an inverted test mode enable signal; and
  a transfer gate for transferring a corresponding one of the first signals from a corresponding one of the first data buses to a corresponding one of the second data buses during the test mode, and intercepting the transferring of the first signal during the normal mode, in response to the test mode enable signal and the inverted test mode enable signal.

22. The multi-port memory device as recited in claim 18, wherein each of the output drivers maintains a high impedance during the test mode in response to the test mode enable signal.

23. The multi-port memory device as recited in claim 18, wherein the output drivers transfer the second signals from the banks to the second data buses during the normal mode.

24. The multi-port memory device as recited in claim 23, wherein the ports deserialize input signals inputted in series from the external devices to output the first signals to the banks via the first data buses, and serialize the second signals inputted in parallel from the banks via the second data buses to output the serialized signals to the serial I/O data pads.

25. The multi-port memory device as recited in claim 24, wherein each of the ports includes:
  a sampler for sampling the input signals;
  a deserializer for deserializing the sampled input signal to output the first signals;
  a data output unit for outputting the first signals to the first data buses in parallel;
  an input latch for latching the second signals transferred through the second buses in parallel;
  a serializer for serializing the latched second signals; and
  a driver for driving the serialized second signals to the serial I/O data pads.

26. The multi-port memory device as recited in claim 25, further comprising a clock generator for generating an internal clock for synchronizing signals serialized and deserialized by the ports.

27. The multi-port memory device as recited in claim 26, wherein the clock generator generates the internal clock based on a reference clock from an external device.

28. The multi-port memory device as recited in claim 26, wherein the input latch, the serializer, the sampler, and the deserializer are synchronized with the internal clock.

29. The multi-port memory device as recited in claim 26, wherein the input latch latches the first signals transferred by a corresponding one of the switching units via the second data buses during the test mode.

30. The multi-port memory device as recited in claim 29, wherein the serializer serializes the first signals latched by the input latch in synchronization with the internal clock.

31. The multi-port memory device as recited in claim 18, wherein each of the first and second data buses includes a latch for transferring the first or second signals stably.

32. A multi-port memory device, comprising:
  a plurality of banks;
  a plurality of ports configured to perform a serial input/output(I/O) data communication with external devices and a parallel I/O data communication with the banks;
  a switching unit configured to transfer from each of the plurality of ports signals originally intended for the banks but redirected to the same respective port as originally transferred from, the signals being redirected back to the same respective port during a test mode for testing the plurality of ports without regard to the plurality of banks; and
  a plurality of output drivers configured to intercept a transferring of the banks to the ports during a test mode,
  wherein each of the output drivers includes:
  a first inverter for inventing a device enable signal for enabling the multi-port memory device;
  a first logic gate performing a NOR operation on an output of the first inverter and the test mode enable signal;
  a second inverter for inverting an output of the first logic gate;
  a third inverter for inverting cell data outputted from a corresponding one of the banks;
  a second logic gate for performing an OR operation on outputs of the second and third inverters;
  a pull-up transistor having a gate receiving an output of the second logic gate and a source-drain path between a source voltage terminal and an output node;
  a third logic gate for performing an AND operation on outputs of the first logic gate and the third inverter; and
  a pull-down transistor having a gate receiving an output of the third logic gate and a source-drain path between a ground voltage terminal and the output node.

* * * * *